United States Patent
Ku et al.

(10) Patent No.: US 9,410,986 B2
(45) Date of Patent: Aug. 9, 2016

(54) TESTING JIG

(71) Applicant: MPI CORPORATION, Zhubei (TW)

(72) Inventors: Wei-Cheng Ku, Zhubei (TW); Hao Wei, Zhubei (TW); Chia-Nan Chou, Zhubei (TW); Chih-Hao Ho, Zhubei (TW)

(73) Assignee: MPI CORPORATION, Zhubei (TW)

( * ) Notice: Subject to any disclaimer, the term of this patent is extended or adjusted under 35 U.S.C. 154(b) by 64 days.

(21) Appl. No.: 14/557,879

(22) Filed: Dec. 2, 2014

(65) Prior Publication Data

US 2015/0204905 A1   Jul. 23, 2015

(30) Foreign Application Priority Data

Dec. 13, 2013  (TW) .............................. 102146097 A

(51) Int. Cl.
  *G01R 1/04*  (2006.01)
(52) U.S. Cl.
  CPC ................................... *G01R 1/0466* (2013.01)
(58) Field of Classification Search
  CPC .............. G01R 1/0466; G01R 1/0483; G01R 31/2893; G01R 1/0408; G01R 1/0433; G01R 31/2886; G01R 1/0441; G01R 3/00; G01R 1/067; G01R 1/06738; G01R 1/06711; G01R 1/07307; G01R 1/06761; G01R 1/07378; G01R 1/06755; G01R 1/06772; G01R 1/06788; G01R 1/06794; G01R 1/073; G01R 1/07314
  See application file for complete search history.

(56) References Cited

U.S. PATENT DOCUMENTS

| 4,765,471 A * | 8/1988 | Murphy ............... G01R 1/0483 206/489 |
| 4,825,155 A * | 4/1989 | Takamine ................ G01R 1/04 324/756.05 |
| 4,866,374 A * | 9/1989 | Cedrone .............. G01R 1/0433 324/537 |
| 5,847,572 A * | 12/1998 | Iwasaki ................ G01R 1/0433 324/754.08 |
| 5,975,915 A * | 11/1999 | Yamazaki ............ G01R 1/0433 439/331 |
| 7,825,677 B2 * | 11/2010 | Takemoto .......... G01R 31/2886 324/762.02 |
| 2009/0311890 A1 * | 12/2009 | Nakayama ......... G01R 1/07371 439/91 |
| 2010/0052722 A1 * | 3/2010 | Takemoto .......... G01R 31/2886 324/754.06 |
| 2011/0248737 A1 * | 10/2011 | Takeshita ........... G01R 31/2889 324/756.02 |
| 2012/0115366 A1 * | 5/2012 | Suzuki ................ G01R 1/0466 439/626 |

* cited by examiner

*Primary Examiner* — Arleen M Vazquez
*Assistant Examiner* — Alesa Allgood
(74) *Attorney, Agent, or Firm* — Terry M. Heims; Apex Juris, Pllc

(57) ABSTRACT

A testing jig includes a substrate, a carrier provided on the substrate, two conductive members made of a conductive material, and a compensation member made of a conductive material. The substrate has a signal circuit and a grounding circuit thereon. The carrier has a base board made of an insulating material and a conductive circuit made of a conductive material provided thereon. The base board has a signal perforation aligning with the signal circuit, a grounding perforation aligning with the grounding circuit, and multiple compensation holes. The conductive members both have an end exposed out of the carrier, and are respectively fitted in the signal perforation and the grounding perforation to make another end thereof contact the signal circuit or the grounding circuit. The compensation member is fitted in one of the compensation holes to be electrically connected to the conductive member in the grounding perforation through the conductive circuit.

8 Claims, 5 Drawing Sheets

TESTING JIG

BACKGROUND OF THE INVENTION

1. Technical Field

The present invention relates generally to an appliance for electrical tests, and more particularly to a testing jig.

2. Description of Related Art

To check electrical connections between precision electronic components in an electronic product, probe cards are widely used as a communication interface for test signals and power signals transmitted between a test machine and a device under test (DUT). A probe card is mainly constructed by a plurality of probes and a rigid multilayer printed circuit board. By contacting a tested portion on a DUT with tips of the probes to transmit test signals thereto, electrical tests can be performed on the DUT.

With the advances in electronic technology, the processing speed of the DUT and signal transmission capacity per second increases, and therefore the frequency of test signals outputted by a test machine also rises. However, probes are quite slender, and the distance between every two neighboring probes is usually arranged in a linear way, which causes higher inductance. Though the amount of inductance is still small, it greatly increases the resistance of the circuit while transmitting test signals in high frequency, which greatly attenuates test signals with high frequency, and consequently, leads to false reading of test signals.

BRIEF SUMMARY OF THE INVENTION

In view of the above, the primary objective of the present invention is to provide a testing jig, which is capable of transmitting test signals in high frequency.

The present invention provides a testing jig, which contacts a DUT with a plurality of pads thereon, wherein the testing jig includes a substrate, a carrier, at least two conductive members, and at least one compensation member. The substrate has at least one signal circuit and at least one grounding circuit provided thereon. The carrier is provided on the substrate, wherein the carrier has a base board and a conductive circuit provided on the base board; the base board is made of an insulating material, while the conductive circuit is made of a conductive material; the base board is provided with at least one signal perforation, at least one grounding perforation, and a plurality of compensation holes, wherein the at least one signal perforation aligns with the at least one signal circuit, and the at least one grounding perforation aligns with the at least one grounding circuit. The at least two conductive members are made of a conductive material, wherein the at least two conductive members are respectively fitted in the at least one signal perforation and the at least one grounding perforation; an end of each of the at least two conductive members contacts the corresponding signal circuit or the corresponding grounding circuit to be electrically connected, and another end of each of the at least two conductive members is exposed out of the carrier to contact one of the pads of the DUT. The at least one compensation member is made of a conductive material, wherein each of the at least one compensation member is fitted in one of the compensation holes to be electrically connected to one of the at least two conductive members fitted in the at least one grounding perforation through the conductive circuit.

With the aforementioned design, attenuation of test signals transmitted in high frequency can be effectively reduced, and therefore test signals can be effectively transmitted in high frequency.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
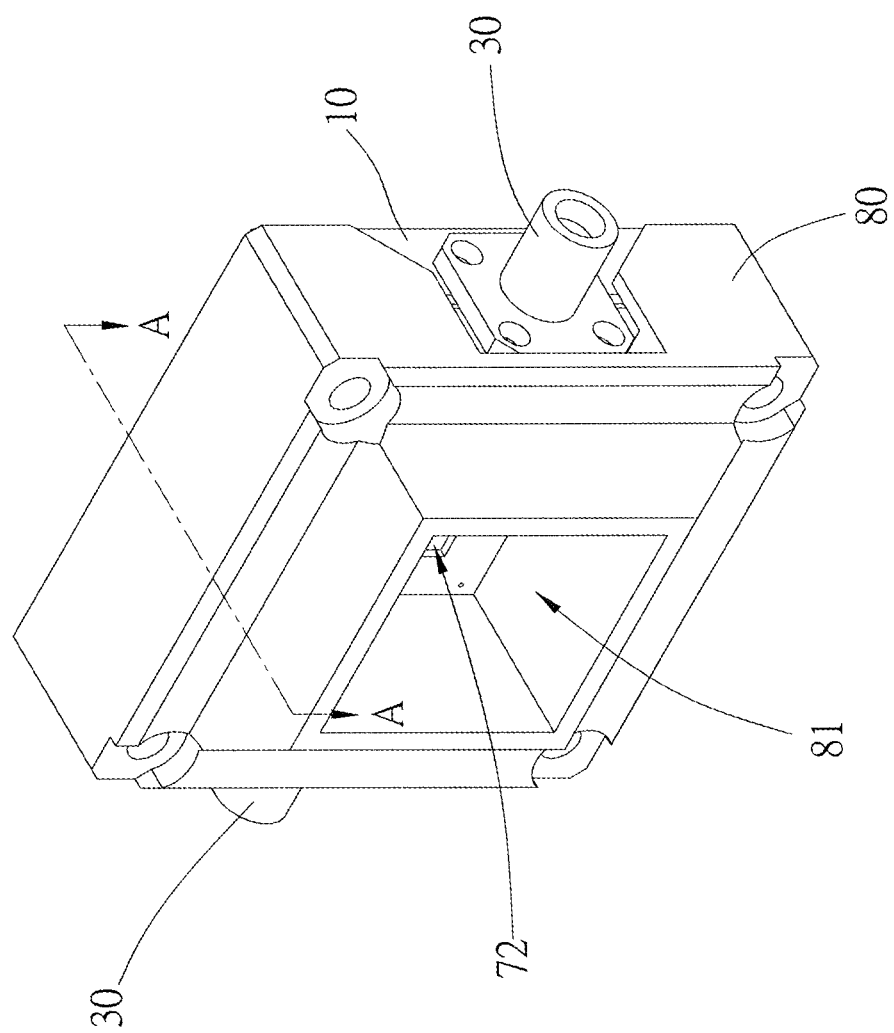
FIG. 1 is a perspective view of a preferred embodiment of the present invention.
Figure 2:
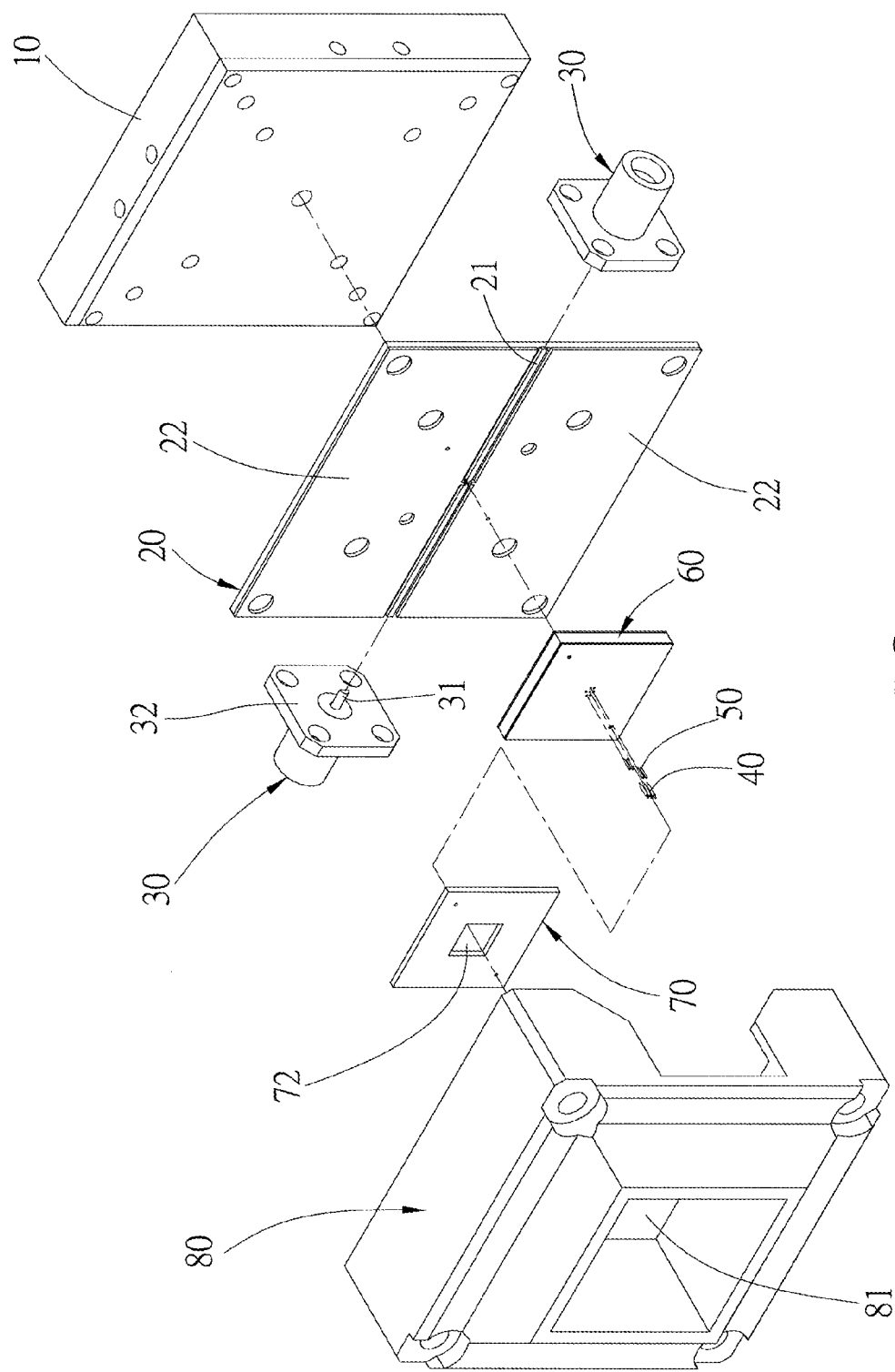
FIG. 2 is an exploded view of the preferred embodiment of the present invention.

As shown in FIG. 1 and FIG. 2, a testing jig of the preferred embodiment of the present invention includes a base 10, a substrate 20, two connectors 30, three conductive members 40, a plurality of compensation members 50, a carrier 60, a positioning seat 70, and a case 80.

The substrate 20 is fixed on the base 10, wherein the substrate 20 is a rigid multilayer printed circuit board (PCB) in the preferred embodiment, which has a signal circuit 21 and two grounding circuits 22 provided thereon. The grounding circuits 22 are provided symmetrically, with the signal circuit 21 located therebetween.

Each of the connectors 30 has a signal electrode 31 and a cover 32, which are both made of a conductive material and are mutually separated. The connectors 30 are respectively provided at two sides of the substrate 20, wherein each of the signal electrodes 31 is electrically connected to the signal circuit 21, while each of the covers 32 is electrically connected to the grounding circuits 22.

The conductive members 40 are flexible, and are made of a conductive material. In the preferred embodiment, the conductive members 40 are pogo pins made of metal, wherein each of the conductive member 40 has a body 41 and two arms 42 provided at two opposite ends of the body 41. An outer diameter of each of the arms 42 is less than an outer diameter of the body 41, and the arms 42 are movable relative to the body 41.

The compensation members 50 are made of a conductive material. In the preferred embodiment, the compensation members 50 are metal pins, which is not a limitation of the present invention.

Figure 3:
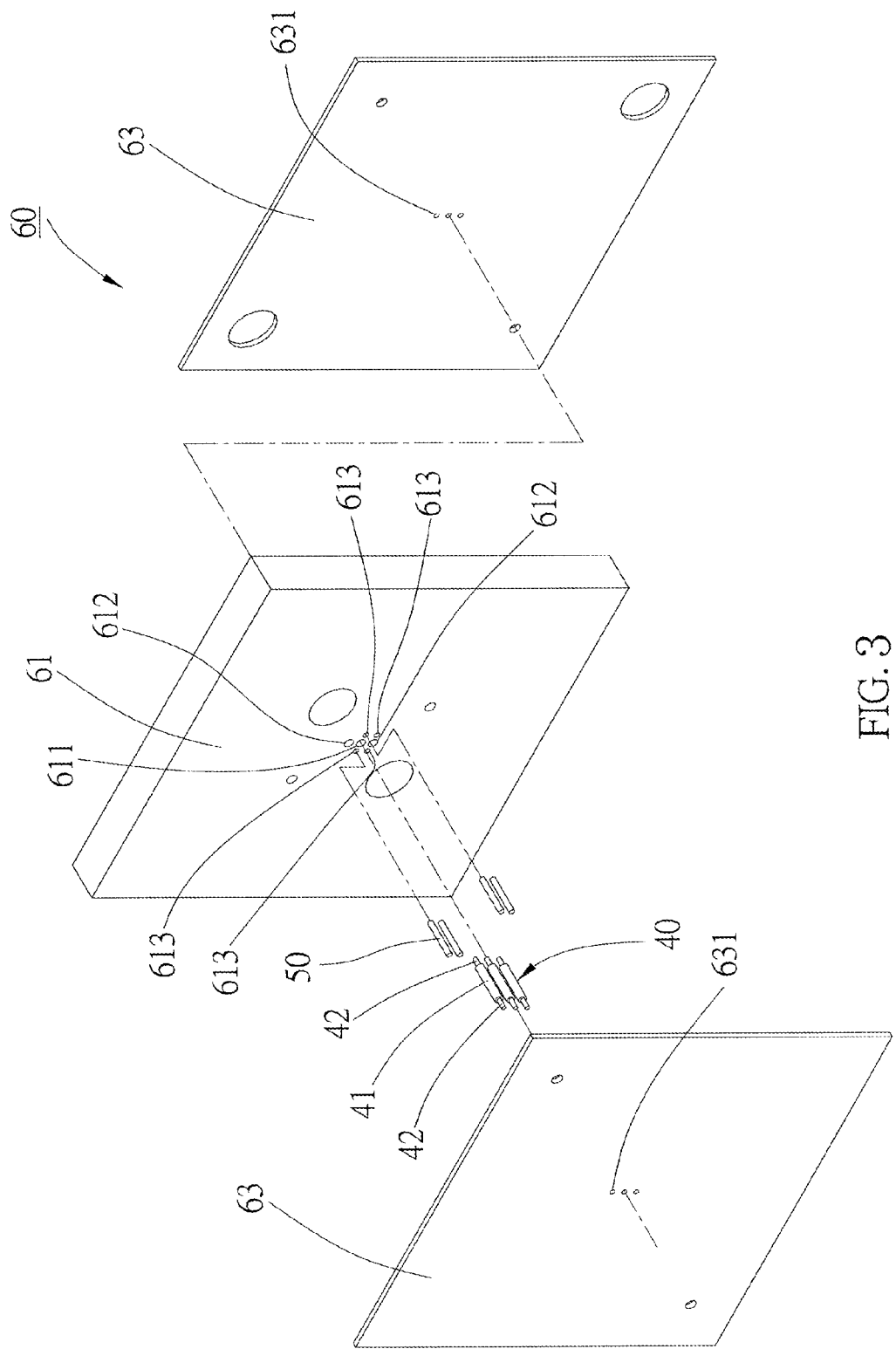
FIG. 3 is an exploded view of the carrier of the preferred embodiment of the present invention.
Figure 4:
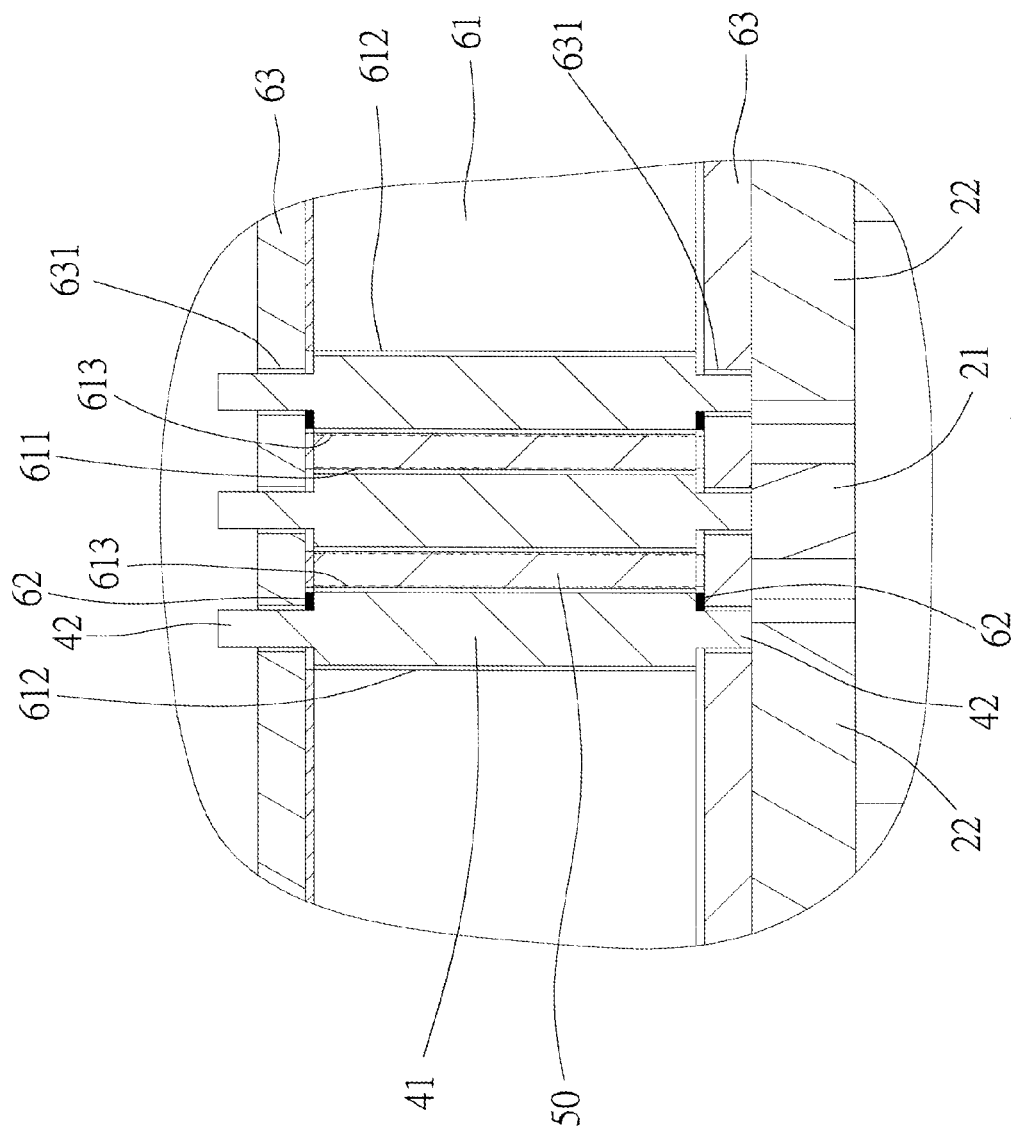
FIG. 4 is an enlarged sectional view along the A-A line in FIG. 1.

As shown in FIG. 3 and FIG. 4, the carrier 60 has a base board 61, a conductive circuit 62, and two restricting members 63. The base board 61 is made of an insulating material, and is provided with a signal perforation 611, two grounding perforations 612, and a plurality of compensation holes 613, wherein the compensation holes 613 surround the signal perforation 611. In other words, the signal perforation 611 is located between the compensation holes 613. Furthermore, the compensation holes 613 are closer to the signal perforation 611 than the grounding perforations 612. The conductive circuit 62 is made of a conductive material, and is embedded in the base board 61. Each of the restricting members 63 is a plate, which has three alignment holes 631 provided thereon, wherein a diameter of each of the alignment holes 631 is less than diameters of the signal perforation 611 and the grounding perforations 612, and is slightly greater than the outer diameter of each arm 42 of the conductive member 40. After the conductive members 40 are respectively fitted into the signal perforation 611 and the grounding perforations 612, and after the compensation members 50 are fitted into the compensation holes 613, the restricting members 63 respectively cover a top side and a bottom side of the base board 61. The alignment holes 631 respectively align with the signal perforation 611 and the grounding perforations 612, whereby the arms 42 of the conductive members 40 can go through the alignment holes 631 to be exposed out of the carrier 60. Therefore, the bodies 41 of the conductive members 40 are firmly fitted in the signal perforation 611 and the grounding perforations 612, while the compensation members 50 are fitted in the compensation holes 613.

In addition, as shown in FIG. 4, when the compensation members 50 are fitted in the compensation holes 613, each of the compensation members 50 is electrically connected to one of the conductive members 40 which is fitted in one of the grounding perforations 612 through the conductive circuit 62. Furthermore, the carrier 60 is provided on the substrate 20 in a way that the signal perforation 611 of the base board 61 aligns with the signal circuit 21, and the grounding perforations 612 align with the grounding circuits 22, whereby the arms 42 at a bottom of the conductive members 40 respectively contact the corresponding signal circuit 21 and grounding circuits 22 to be electrically connected.

The positioning seat 70 is provided on the carrier 60, wherein the positioning seat 70 has a through hole 72, and the arms 42 of the conductive members 40 which are exposed out of the carrier 60 are within an orthographic projection range of the through hole 72.

The case 80 is connected on the base 10 to encase the positioning seat 70, the carrier 60, and the substrate 20 inside the case 80. In addition, the case 80 has a tapered opening 81 which communicates the inner side of the case 80 with outside, wherein the tapered opening 81 tapers outwardly, e.g., the tapered opening 81 has smaller cross sectional area at an end thereof near the carrier 60. The tapered opening 81 is communicated to the through hole 72 of the positioning seat 70.

To do electrical tests with the aforementioned design, the connectors 30 are connected to a test machine (not shown), and a device under test (DUT) is placed into through hole 72 by using a chuck (not shown). The tapered walls of the tapered opening 81 are helpful to guide the chuck to pass therethrough, and therefore the DUT can be quickly and steadily placed into the through hole 72 of the positioning seat 70. The walls of the through hole 72 can restrict the DUT from shifting. Whereby, the arms 42 of the conductive members 40 which are exposed out of the carrier 60 can contact pads on the DUT to be electrically connected. As a result, a signal transmission path is formed with the conductive member 40 fitted in the signal perforation 611, the signal circuit 21, and the signal electrodes 31, while a grounding path is also formed with the conductive members 40 fitted in the grounding perforations 612, the compensation members 50, the grounding circuits 22, and the cover 32. Electrical tests can be started to perform at this point.

Figure 5:
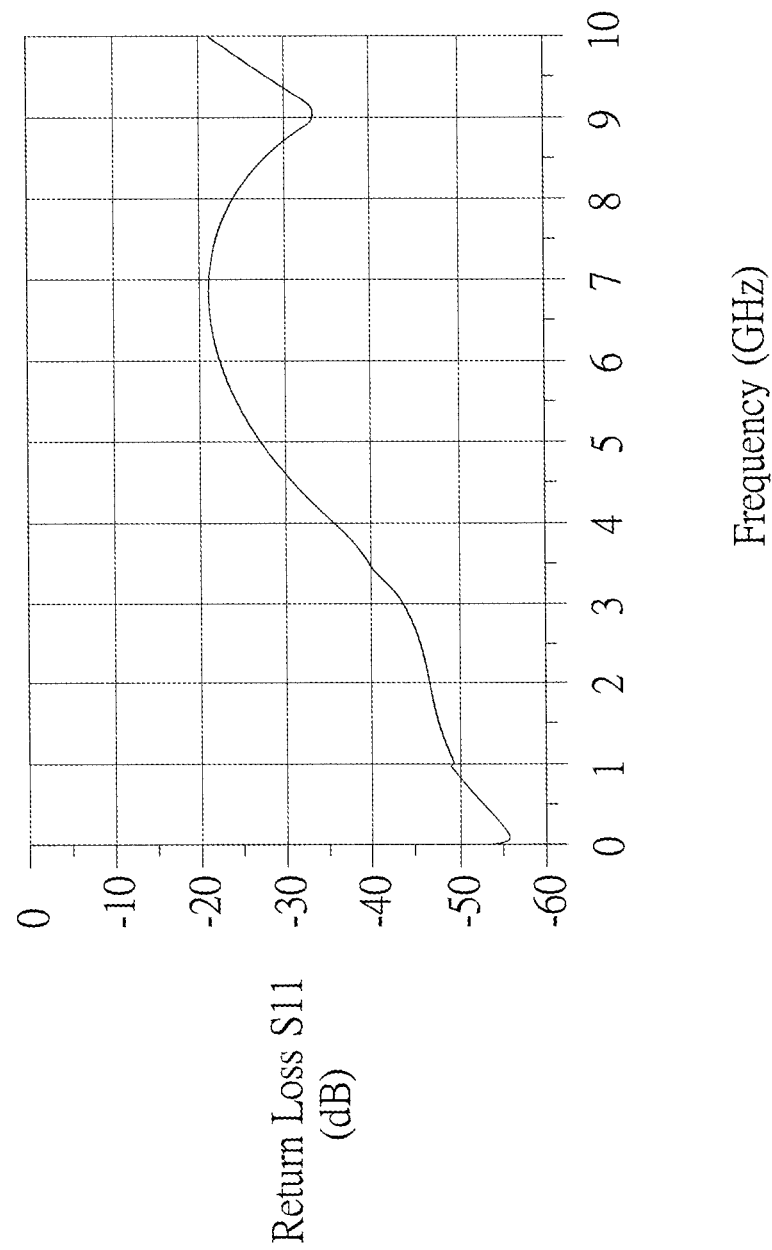
FIG. 5 is a diagram showing how much test signals of different frequency attenuate after passing through the preferred embodiment of the present invention.

With the compensation holes 613 and the compensation members 50, the grounding path can be much closer to the signal transmission path, which effectively decreases the inductance of the circuit, and also increases the capacitance. Consequently, the resistance of the circuit while transmitting test signals in high frequency can be effectively lowered, and therefore the problem of attenuation can be greatly eased, which can be clearly seen in FIG. 5. Specifically, the return loss S11 is maintained at around −20 dB after the test signals of 10 GHz passing through the aforementioned signal transmission path and the grounding path. Therefore, false reading of test signals of high frequency can be avoided.

It is worth mentioning that the numbers of the signal perforation 611, the grounding perforations 612, the signal circuit 21, and the grounding circuits 22 described in the preferred embodiment are not limitations of the present invention. In other embodiment, the numbers of these components can be different.

The embodiment described above is only a preferred embodiment of the present invention. All equivalent constructions which employ the concepts disclosed in this specification and the appended claims should fall within the scope of the present invention.

What is claimed is:

1. A testing jig, which contacts a DUT with a plurality of pads thereon, comprising:
    a substrate having at least one signal circuit and at least one grounding circuit provided thereon;
    a carrier provided on the substrate, wherein the carrier has a base board and a conductive circuit provided on the base board; the base board is made of an insulating material, while the conductive circuit is made of a conductive material; the base board is provided with at least one signal perforation, at least one grounding perforation, and a plurality of compensation holes, wherein the at least one signal perforation aligns with the at least one signal circuit, and the at least one grounding perforation aligns with the at least one grounding circuit;
    at least two conductive members made of a conductive material, wherein the at least two conductive members are respectively fitted in the at least one signal perforation and the at least one grounding perforation; an end of each of the at least two conductive members contacts the corresponding signal circuit or the corresponding grounding circuit to be electrically connected, and another end of each of the at least two conductive members is exposed out of the carrier to contact one of the pads of the DUT; and
    at least one compensation member made of a conductive material, wherein each of the at least one compensation member is fitted in one of the compensation holes to be electrically connected to one of the at least two conductive members fitted in the at least one grounding perforation through the conductive circuit.

2. The testing jig of claim 1, further comprising at least one connector, having a signal electrode and a cover, which are both made of a conductive material, and are separated with each other; the signal electrode is electrically connected to one of the at least one signal circuit, while the case is electrically connected to the at least one grounding circuit.

3. The testing jig of claim 1, wherein the compensation holes surround the at least one signal perforation.

4. The testing jig of claim 1, wherein each of the at least one signal perforation is provided between two of the compensation holes.

5. The testing jig of claim 1, wherein the carrier further has a restricting member, which is a plate and is provided on the base board, wherein the restricting member has at least two alignment holes, which respectively align with the at least one signal perforation and the at least one grounding perforation.

6. The testing jig of claim 5, wherein a diameter of each of the at least two alignment holes is less than diameters of the at least one signal perforation and the at least one grounding perforation.

7. The testing jig of claim 1, further comprising a positioning seat provided on a top of the substrate, wherein the positioning seat has a through hole communicating a top and a bottom of the positioning seat; the part of the at least two conductive members exposed out of the carrier is with an orthographic projection range of the through hole.

8. The testing jig of claim 7, further comprising a case which has a tapered opening communicating an inner side of the case with outside, wherein the tapered opening tapers outwardly, with a cross sectional area at an end thereof near the carrier to be smaller than a cross sectional area at the opposite end; the tapered opening communicates with the through hole of the positioning seat.

* * * * *